United States Patent

Hsia et al.

[11] Patent Number: 6,037,262
[45] Date of Patent: Mar. 14, 2000

[54] PROCESS FOR FORMING VIAS, AND TRENCHES FOR METAL LINES, IN MULTIPLE DIELECTRIC LAYERS OF INTEGRATED CIRCUIT STRUCTURE

[75] Inventors: Shouli Steve Hsia; Jiunn-Yann Tsai, both of San Jose, Calif.

[73] Assignee: LSI Logic Corporation, Milpitas, Calif.

[21] Appl. No.: 09/098,032

[22] Filed: Jun. 15, 1998

[51] Int. Cl.[7] ................................................. H01L 21/311
[52] U.S. Cl. .......................... 438/700; 438/702; 438/740; 438/743; 438/744
[58] Field of Search ........................... 438/618, 622–624, 438/637, 700, 702, 740, 743, 744; 257/635, 637, 640, 758–760

[56] References Cited

U.S. PATENT DOCUMENTS

| | | | |
|---|---|---|---|
| 5,466,639 | 11/1995 | Ireland | 438/633 |
| 5,753,967 | 5/1998 | Lin | 257/635 |
| 5,897,375 | 4/1999 | Watts et al. | 438/693 |
| 5,920,790 | 7/1999 | Wetzel et al. | 438/618 |

*Primary Examiner*—Benjamin L. Utech
*Assistant Examiner*—Donald L. Champagne
*Attorney, Agent, or Firm*—John P. Taylor

[57] ABSTRACT

A process is disclosed for forming vias and trenches in two separate dielectric layers, which may be separated by an etch stop, while avoiding the etch mask stress complicated resist masks, or high aspect ratio openings of the prior art. A first dielectric layer 10 is formed over an integrated circuit structure 2 on a semiconductor substrate, and a thin second dielectric layer 20 is formed over the first dielectric layer. A first resist mask, is formed over the second dielectric layer, and the first and second dielectric layers are etched through to form one or more vias 18, 28 extending through both the first and second dielectric layers. The first resist mask is then removed and a third dielectric layer 70, having different etch characteristics than the second dielectric layer, is deposited over the structure. This third dielectric layer, which may comprise the same material as the first dielectric layer, is applied to the structure as a low step coverage, nonconformal coating layer which preferably does not completely fill the one or more vias already formed in the first and second dielectric layers. A second resist mask is then applied over the third dielectric layer and the third dielectric layer is etched through to the underlying second dielectric layer to form the desired trench openings 78, with the second dielectric material acting as an etch stop, and also as an etch mask for removal of any of the third dielectric layer material which has deposited in the via(s) previously formed in the first and second dielectric layers.

23 Claims, 5 Drawing Sheets

PROCESS FOR FORMING VIAS, AND TRENCHES FOR METAL LINES, IN MULTIPLE DIELECTRIC LAYERS OF INTEGRATED CIRCUIT STRUCTURE

BACKGROUND OF THE INVENTION

1. Field of the Invention

This invention relates to the construction of integrated circuit structures. More particularly, this invention relates to the respective construction of vias, and trenches for metal lines in multiple dielectric layers useful for the formation of filled vias and metal interconnects comprising a portion of an integrated circuit structure.

2. Description of the Related Art

Conventionally, in the construction of a metal wiring or interconnect structure for an integrated circuit structure, a metal layer is blanket deposited over a dielectric layer containing filled (or unfilled) vias and this metal layer is then patterned, using an appropriate mask, into the desired metal interconnect structure. Unfortunately, not all metals are easily patterned (etched) in this manner.

To form a metal interconnect structure using such metals which are not easily etched, it has been proposed to form a series of trenches in an upper dielectric layer formed over the dielectric layer containing the vias, with the trenches in the upper dielectric layer in registry with the underlying vias. After the trenches are formed, a metal layer is blanket deposited over the entire structure to fill the trenches. Metal deposited on the surface of the dielectric layer containing the trenches is then removed, e.g., by a chemical/mechanical polishing (CMP) process, leaving the desired pattern of metal interconnects in the trenches. In some instances, the same metal deposition step is also used to fill vias, previously formed in another dielectric layer lying below the dielectric layer used for the trench formation.

Several conventional prior art processes have been used to form this type of structure with openings in multiple dielectric layers of an integrated circuit structure wherein one or more vias are formed in a lower dielectric layer, and one or more trenches are then formed, in registry with the vias, in an upper dielectric layer. One such prior art process is illustrated in prior art FIGS. 1–3. A first dielectric layer 10, e.g., a silicon oxide layer, is formed over an integrated circuit structure generally denoted at 2 which may comprise an underlying layer of metal interconnects formed over a dielectric layer on a semiconductor substrate, or a dielectric layer with filled contact openings formed over devices in a semiconductor substrate, or over another dual layer via and trench construct. First dielectric layer 10 may range in thickness from greater than 0.5 micrometers ($\mu$m) up to about 2 $\mu$m, but typically will be about 1 $\mu$m in thickness.

Figure 1:
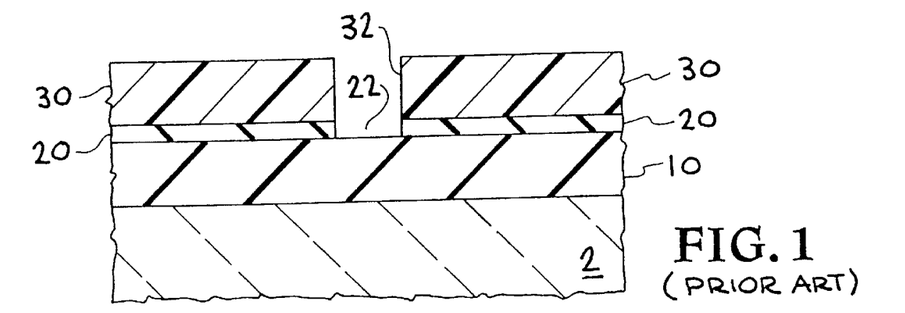
FIG. 1 is a fragmentary vertical cross-sectional view of a prior art structure after formation of a via mask opening through the thin second dielectric layer, using a first resist mask.

Over first dielectric layer 10 is formed a thin second dielectric layer 20 formed of a different dielectric material than layer 10, e.g., silicon nitride, to permit second dielectric layer 20 to function as an etch stop and an etch mask as will be explained below. Thin second dielectric layer 20 may vary in thickness from about 200 Angstroms (Å) up to about 800 Å, and typically will be about 400 Å in thickness.

In this process, a first resist mask layer 30 is then formed over second dielectric layer 20 with one or more openings formed therein, as illustrated at 32, corresponding to the size of one or more vias to be eventually formed in first dielectric layer 10. As shown in FIG. 1, second dielectric layer 20 is etched through opening 32 in first resist mask 30 to form an opening 22 in second dielectric layer 20 which will eventually be used as an etch mask for the formation of a via in first dielectric layer 10. Typically an etch system is used which will be selective to first dielectric layer 10, i.e., will preferentially etch second dielectric layer 20 rather than first dielectric layer 10. For example, when first dielectric layer 10 comprises silicon oxide and second dielectric layer 20 comprises silicon nitride, a $CHF_3$, $CF_4$, and $O_2$ plasma etch system can be used to preferentially etch silicon nitride second dielectric layer 20.

Figure 2:
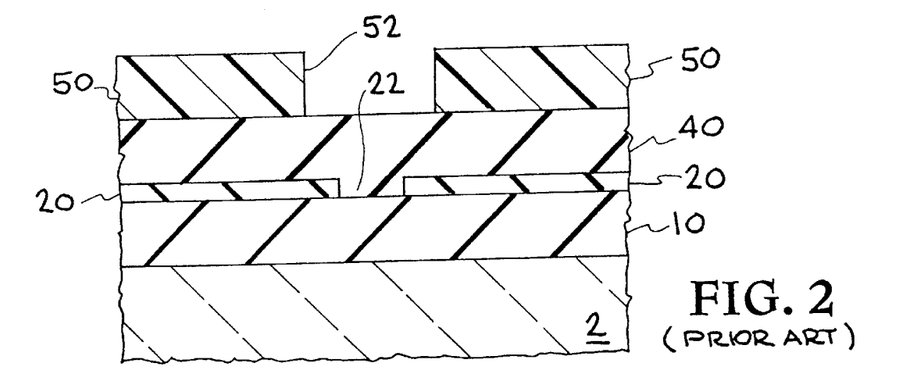
FIG. 2 is a fragmentary vertical cross-sectional view of the prior art structure of FIG. 1 after removal of the first resist mask, the deposition of a third dielectric layer over the thin second dielectric layer, and formation of a second resist mask opening over the third dielectric layer.

As shown in FIG. 2, after formation of opening 22 in second dielectric layer 20, first resist mask 30 is removed and a third dielectric layer 40 is deposited over second dielectric layer 20. Third dielectric layer 40 comprises a material different than second dielectric layer 20 and may comprise the same material, e.g., silicon oxide, as first dielectric layer 10. Third dielectric layer 40 may be formed in the same thickness range as first dielectric layer 10. As also shown in FIG. 2, a second resist mask 50 is then formed over third dielectric layer 40. Second resist mask 50 has one or more openings therein, as illustrated at 52, corresponding to the size and configuration of a pattern of trenches to be formed in third dielectric layer 40. It will be noted that trench opening 52 in second resist mask 50 is in registry with mask opening 22 in second dielectric layer 20, so that the trench eventually formed in third dielectric layer 40, through mask opening 52, will be in registry with the via formed in first dielectric layer 10 through mask opening 22 in second dielectric layer 20.

After formation of second resist mask 50 over third dielectric layer 40, the structure is subject to an etch using an etch system which will etch third dielectric layer 40 (through mask opening 52 in second resist mask 50) and first dielectric layer 10 (through opening 22 in second dielectric layer 20), but which is selective to second dielectric layer 20, i.e., will preferentially etch the dielectric material of dielectric layers 10 and 40. Second dielectric layer 20 then acts as an etch stop to permit a trench 42 to be formed in third dielectric layer 40 (through mask opening 52 in mask 50). At the same time, second dielectric layer 20 acts as an etch mask to permit formation of via 12 in first dielectric layer 10 through previously formed mask opening 22 in second dielectric layer 20. For example, when first dielectric layer 10 and third dielectric layer 40 both comprises silicon oxide and second dielectric layer 20 comprises silicon nitride, a $CF_4$, $C_4F_8$, and argon plasma etch system can be used to preferentially etch silicon oxide first dielectric layer 10 and silicon oxide third dielectric layer 40. Thus, silicon nitride second dielectric layer 20 functions both as an etch stop (while forming trench opening 42 in third dielectric layer 40) and as an etch mask (when etching via 12 in first dielectric layer 10). The resulting structure is shown in prior art FIG. 3. Resist mask 50 can then be removed, and conventional via and trench lining processing, and via and trench metal filling processing, can then be performed.

While the afore-described process does form the desired via 12 in first dielectric layer 10, while also forming trench 42 in third dielectric layer 40, the additional use of second dielectric layer 20 as an etch mask (rather than merely as an etch stop to permit independent etching of first dielectric layer 10 and third dielectric layer 40), puts additional etching stress on second dielectric layer 20.

Figure 4:
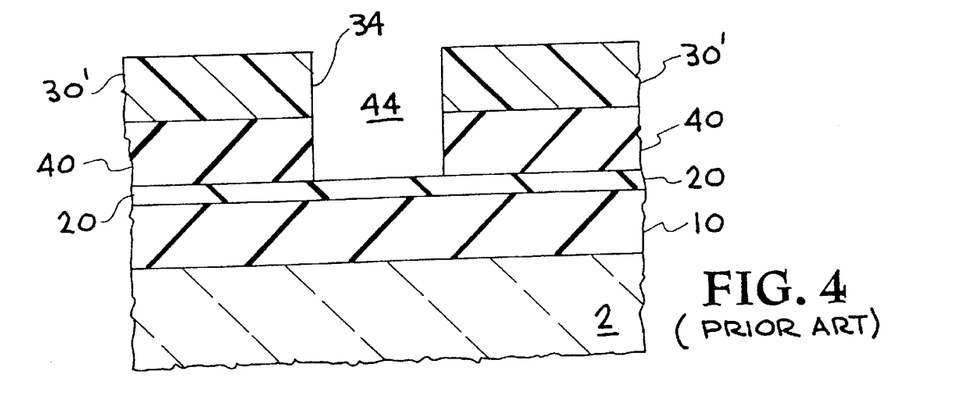
FIG. 4 is a fragmentary vertical cross-sectional view of another prior art structure comprising first, second, and third dielectric layers with a first resist mask formed over the third dielectric layer, and the third dielectric layer etched through the first resist mask to form one or more trenches in the third dielectric layer.
Figure 5:
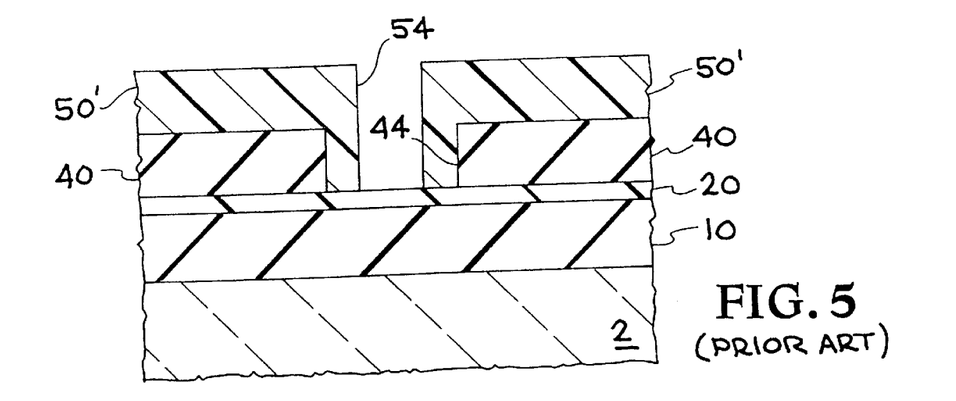
FIG. 5 is a fragmentary vertical cross-sectional view of the prior art structure of FIG. 4 after removal of the first resist mask and formation of a second resist mask over the third dielectric layer and in the newly formed trench opening etched in the third dielectric layer.
Figure 6:
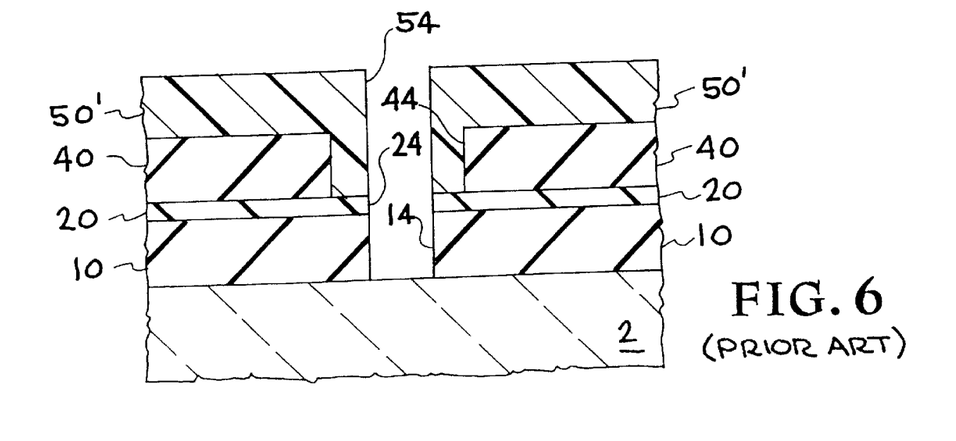
FIG. 6 is a fragmentary vertical cross-sectional view of the prior art structure of FIG. 5 after etching of a via in the first and second dielectric layers through an opening in the second resist mask.

Another conventional process which is used for respectively forming vias and trenches in two dielectric layers separated by a thin additional dielectric layer acting as an etch stop is shown in prior art FIGS. 4–6. As shown in FIG. 4, first dielectric layer 10 is again formed over underlying integrated circuit structure 2, and thin second dielectric layer 20 is again formed over first dielectric layer 10. In this process, however, third dielectric layer 40 is then formed directly over second dielectric layer 20 prior to any etching steps. First resist mask 30' is then formed over third dielectric layer 40 with one or more mask openings, such as illustrated by mask opening 34 therein corresponding to the desired size of the trenches to be formed in third dielectric layer 40. An opening 44 corresponding to the desired trench is then formed in third dielectric layer 40 through mask opening 34 by the same selective plasma etching as previously described, as also shown in FIG. 4.

First resist mask 30' is then removed and replaced by second resist mask 50' which is formed over third dielectric layer 40 and into newly formed opening 44 in third dielectric layer 40. As seen in FIG. 5, second resist mask 50' has an opening 54 therein corresponding in size to a via opening to be formed in dielectric layers 10 and 20.

Second dielectric layer 20 and first dielectric layer 10 are then etched through opening 54 in second resist mask 50', using appropriate etchants systems as earlier discussed, to form via opening 24 in second dielectric layer 20 and via opening 14 in first dielectric layer 10, as shown in FIG. 6. It should be noted here, however, that the etchant system(s) used for this step of etching through both first dielectric layer 10 and second dielectric layer 20 need not be selective to either of the first and second dielectric layers, since both will be etched. That is, a common etchant system may be used, if desired, which is capable of etching both the first and second dielectric layers. After forming vias 14 and 24 respectively (via 14/24) in dielectric layers 10 and 20, second resist mask 50' may be removed and the previously described conventional via and trench lining processing, and via and trench metal filling processing, can then be performed.

Figure 3:
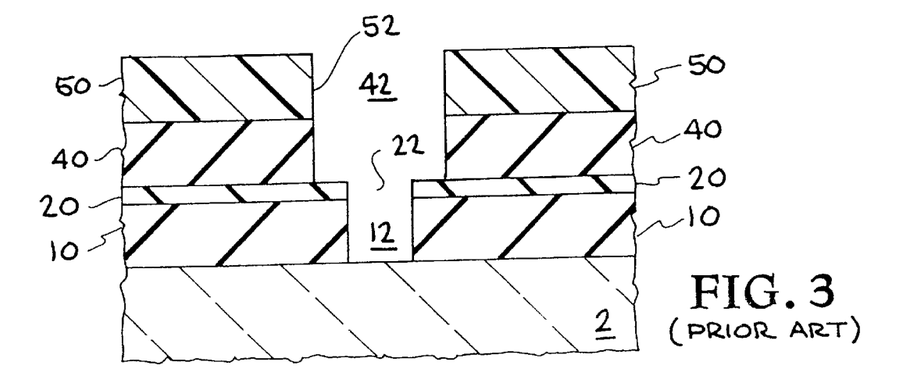
FIG. 3 is a fragmentary vertical cross-sectional view of the prior art structure of FIG. 2 after etching of the third dielectric layer through the second resist mask to form a trench in the third dielectric layer.

While this second process does not subject second dielectric layer 20 to the stress of usage as an etch mask as in the process of FIGS. 1–3, it does require a more complicated second resist mask 50' which must partially fill trench opening 44 formed in the third dielectric layer 40, while preserving the desired dimensional integrity of the via opening formed in second resist mask 50'.

Figure 7:
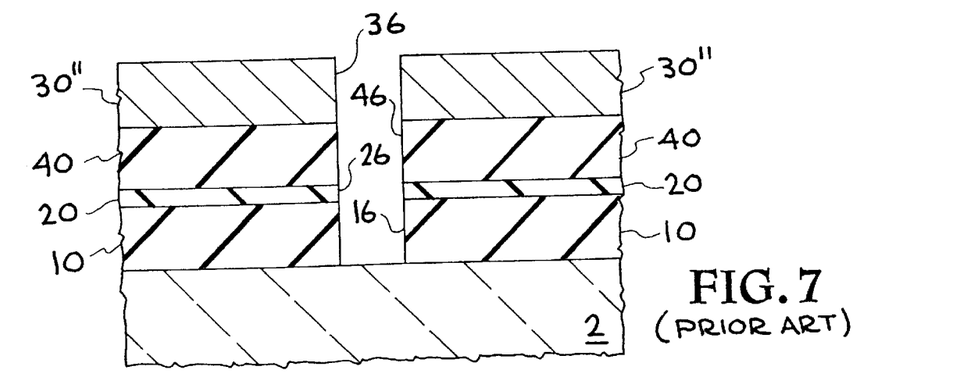
FIG. 7 is a fragmentary vertical cross-sectional view of a third prior art structure comprising first, second, and third dielectric layers with a first resist mask formed over the third dielectric layer, and the three dielectric layers all etched through the first resist mask to form a via.
Figure 8:
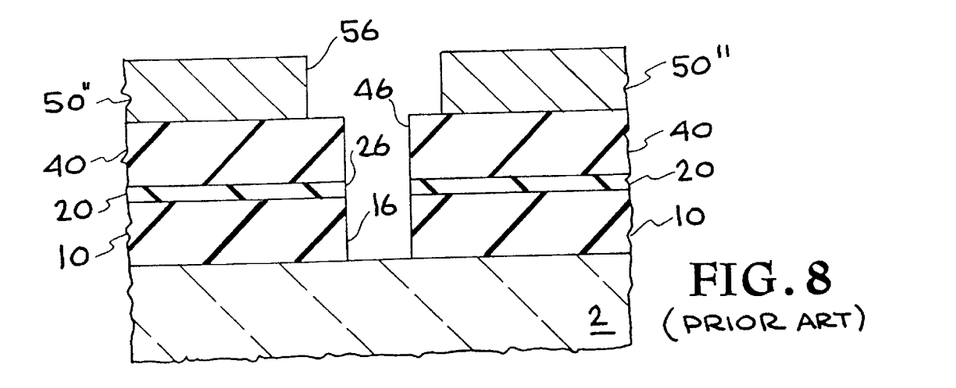
FIG. 8 is a fragmentary vertical cross-sectional view of the prior art structure of FIG. 7 after removal of the first resist mask and formation of a second resist mask over the third dielectric layer.
Figure 9:
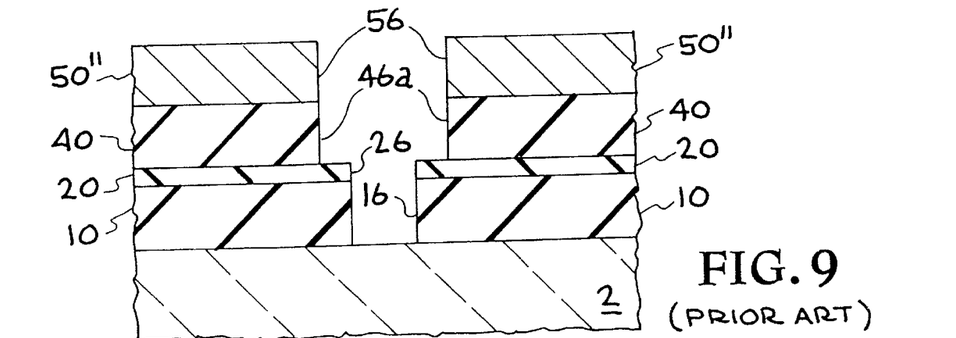
FIG. 9 is a fragmentary vertical cross-sectional view of the prior art structure of FIG. 8 after etching of the third dielectric layer through the second resist mask to form a trench in the third dielectric layer in registry with the underlying via in the first and second dielectric layers.

Yet a third prior art process has been used for respectively forming vias and trenches in two dielectric layers separated by another thin dielectric layer acting as an etch stop, as shown in prior art FIGS. 7–9. In this process, as in the process of FIGS. 4–6, first, second, and third dielectric layers 10, 20, and 40 are first formed respectively over integrated circuit structure 2, and then first resist mask 30" is applied, having a mask opening 36 therein corresponding to the size of the via to be formed in first dielectric layer 10 and second dielectric layer 20, as shown in FIG. 7. All three dielectric layers (10, 20, and 40) are etched through mask opening 36 in first resist mask 30", as shown in FIG. 7 to form openings 16, 26, and 46, respectively through the three dielectric layers. First resist mask 30" is then removed and replaced by second resist mask 50" which is formed over third dielectric layer 40, as shown in FIG. 8. Second resist mask 50" has a mask opening 56 therein corresponding dimensionally to a desired trench to be formed in third dielectric layer 40. Third dielectric layer 40 is then etched through mask opening 56, as shown in FIG. 9, with second dielectric layer 20 functioning as the etch stop to form trench opening 46a in third dielectric layer 40. Similar to the previously described processes, second resist mask 50'" may then be removed and the previously described conventional via and trench lining processing, and via and trench metal filling processing, can then be performed.

While this third conventional prior art process eliminates the etch mask stress on second dielectric layer 20 of the first process shown in FIGS. 1–3, and also eliminates the complicated second resist mask 50' of the process of FIGS. 4.6, it does result in the need to etch and clean a high aspect ratio opening in the first step where the via opening is formed through all three dielectric layers by forming openings 16, 26, and 46 through respective dielectric layers 10, 20, and 40 using resist mask opening 36.

It would, therefore, be desirable to provide a process capable of respectively forming vias and trenches in multiple dielectric layers which may be separated from one another by a thin dielectric layer acting as an etch stop, while avoiding the etch mask stress on the thin dielectric layer of the process of FIGS. 1–3, the complicated resist mask of the process of FIGS. 4–6, and the high aspect ratio opening of the process of FIGS. 7–9.

SUMMARY OF THE INVENTION

In accordance with the invention, a process capable of respectively forming vias and trenches in multiple dielectric layers comprises: forming a first dielectric layer over an integrated circuit structure on a semiconductor substrate, and then forming a thin second dielectric layer over the first dielectric layer, with the second dielectric layer formed of a dielectric material having different etch characteristics than the first dielectric layer. A first mask, such as a photoresist mask, having one or more openings corresponding to vias to be formed in the first and second dielectric layers, is formed over the second dielectric layer, and the first and second dielectric layers are then etched through this first mask to form one or more vias extending through both the first and second dielectric layers. The first mask is then removed and a third dielectric layer is deposited over the structure. This third dielectric layer, which may comprise the same material as the first dielectric layer, is preferably applied to the structure as a low step coverage, nonconformal coating layer which does not completely fill the one or more vias formed in the first and second dielectric layers. A second mask, which also may comprise a photoresist mask, is then applied over the third dielectric layer having one or more mask openings therein corresponding to the dimensions of one or more trenches to be formed in the third dielectric layer in registry with the one or more vias. The third dielectric layer is then etched through the second mask to form the desired trench openings, with the second dielectric material acting as an etch stop for the trench opening(s), and also as an etch mask for removal of any of the third dielectric layer material which was deposited in the via(s) previously formed in the first and second dielectric layers. The second mask is then removed and conventional processing of the via(s) and trench(es) can then be carried out.

DETAILED DESCRIPTION OF THE INVENTION

The invention comprises an improved process for respectively forming trenches and vias in registry with the trenches in separate dielectric layers which layers may be contiguous, but preferably are separated by a thin intermediate dielectric layer of a different material than the other dielectric layers and which can, therefore, act as an etch stop to permit independent processing of the other dielectric layers. The invention permits the formation of the vias and trenches respectively in separate dielectric layers while avoiding or mitigating etch mask stress on thin intermediate dielectric layer, or the use of complicated resist masks in the process, or the formation of difficult to form and clean high aspect ratio openings.

Figure 10:
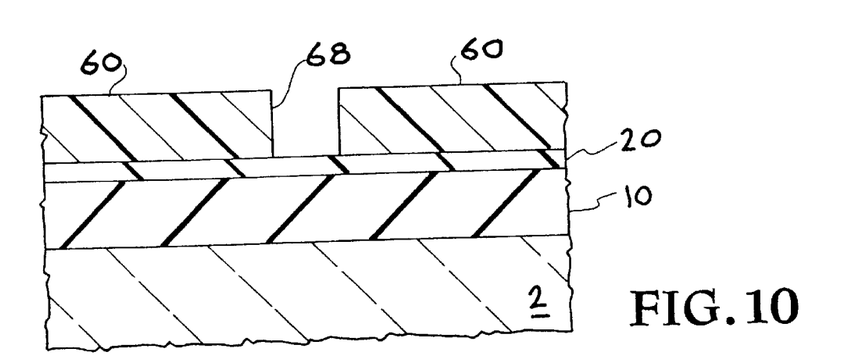
FIG. 10 is a fragmentary vertical cross-sectional view illustrating the process of the invention showing first and second dielectric layers formed over an integrated circuit structure including a semiconductor substrate, with a first mask formed over the second dielectric layer.

Turning now to FIG. 10, a first dielectric layer 10 is shown formed over an integrated circuit structure generally denoted at 2. Integrated circuit structure 2 may comprise an underlying layer of metal interconnects formed over one or more filled vias in one or more dielectric layers which, in turn, are formed over active devices of the integrated circuit structure on and in a semiconductor substrate. Alternately, integrated circuit structure 2 may comprise a dielectric layer with filled contact openings formed over devices in a semiconductor substrate. First dielectric layer 10 may range in thickness from greater than 0.5 micrometers ($\mu$m) up to about 2 $\mu$m, but typically will be about 1 $\mu$m in thickness. First dielectric layer 10 may comprise any dielectric material provided it is compatible with the materials it is formed over. For example, silicon oxide ($SiO_2$) is considered to be an acceptable dielectric material (and is actually a preferred material) for first dielectric layer 10, whereas silicon nitride may not be (depending upon the underlying material), since a layer of silicon nitride formed, for example, over a silicon layer, can result in the introduction of stress into the structure.

In one embodiment of the invention, over dielectric layer 10 is formed a thin second dielectric layer 20, as also shown in FIG. 10. Thin second dielectric layer 20 is formed of a different dielectric material than dielectric layer 10, to permit second dielectric layer 20 to function as an etch stop and at least partially as an etch mask as will be explained below. Thin second dielectric layer 20 should, therefore, be thick enough to function satisfactorily as an etch stop and at etch mask. However since a third dielectric layer will be formed over second dielectric layer 20 (to permit formation of trenches therein as will be explained below), it is unnecessary for the thickness of second dielectric layer 20 to be in excess of that needed for the above described desired functions of second dielectric layer 20 and excessive thickness may actually be deleterious, since this would further extend the height (and therefore the resistive path) of the vias which pass through first dielectric layer 10 and second dielectric layer 20. Thin second dielectric layer 20 will, therefore, usually vary in thickness from about 200 Å up to about 800 Å, and typically will be about 400 Å in thickness. Therefore, the use of the term "thin" herein, in connection with the thickness of second dielectric layer 20 will be understood to define such a thickness range.

Since the purpose of forming thin second dielectric layer 20 over first dielectric layer 10 is to permit thin second dielectric layer to function as an etch stop and etch mask, thin second dielectric layer 20 should comprise a dielectric material having different etch characteristics than the dielectric material used to form first dielectric layer 10. When first dielectric layer 10 preferably comprises silicon oxide, for example, a satisfactory dielectric material for thin second layer 20 is silicon nitride.

Still referring to FIG. 10, a first mask 60, which may comprise a photoresist mask, is formed over thin second dielectric layer 20. First mask 60 has one or more openings therein, illustrated in FIG. 10 by opening 68, to permit etching of one or more vias in underlying thin second dielectric layer 20 and first dielectric layer 10 through first mask 60.

Figure 11:
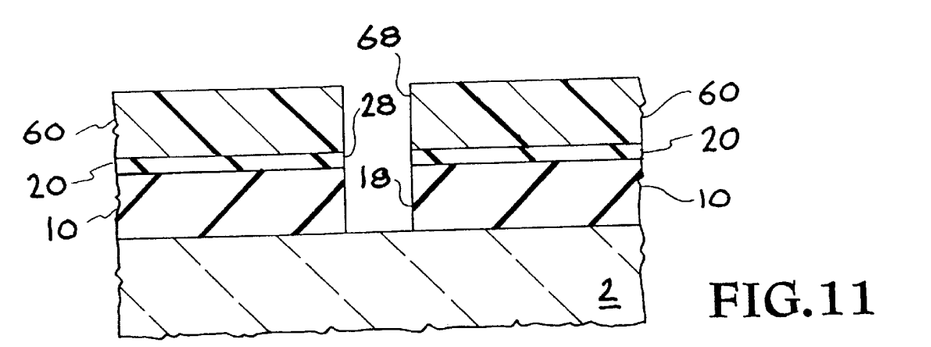
FIG. 11 is a fragmentary vertical cross-sectional view of structure of FIG. 10 after formation of a via in the first and second dielectric layer through an opening in the first resist mask.

FIG. 11 illustrates the formation of via opening 28 in thin second dielectric layer 20 and via 18 in first dielectric layer 10 through mask opening 68 in first mask 60 (hereinafter referred to as via 18/28). Since this etch step will be carried out to remove exposed material of both thin second dielectric layer 20 and first dielectric layer 10, it will not be necessary to use an etch system for thin second dielectric layer 20 which is selective to the material of first dielectric layer 10, nor will the converse be needed when etching first dielectric layer 10. However, for convenience, when first dielectric layer 10 comprises silicon oxide and second dielectric layer 20 comprises silicon nitride, the previously described etch systems may be used for the respective layers. That is, for example, a $CHF_3$, $CF_4$, and $O_2$ plasma etch system may be used to etch through thin second dielectric layer 20 of silicon nitride followed by use of a $CF_4$, $C_4F_8$, and Ar plasma etch system to etch through first dielectric layer 10 of silicon oxide to form the desired via(s).

Figure 12:
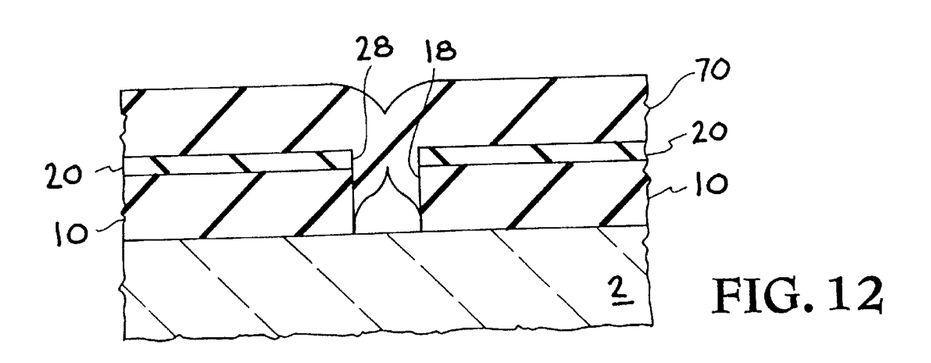
FIG. 12 is a fragmentary vertical cross-sectional view of structure of FIG. 11 after removal of the first mask and formation of a third dielectric layer over the first and second dielectric layer and extending partially into the via formed in the first and second dielectric layers.

After etching via 18/28 in dielectric layers 10 and 20, first mask 60 is removed and a third layer 70 of dielectric material is formed over thin second dielectric layer 20, as shown in FIG. 12. Third dielectric layer 70 must comprise a dielectric material with different etch characteristics than thin second dielectric layer 20, since second dielectric layer 20 will be used as an etch stop when etching a trench in third dielectric layer 70. However, third dielectric layer 70 may comprise the same dielectric material as used in forming first dielectric layer 10. Preferably, third dielectric layer 70 will comprise silicon oxide ($SiO_2$) when second dielectric layer 20 comprises silicon nitride. The thickness of third dielectric layer 70 will be governed by the desired thickness of the metal wiring harness (metal interconnects), since the trenches which will be used in the formation of the metal interconnects will be etched completely through third dielectric layer 70, stopping at second dielectric layer 20 below. Usually, the thickness of third dielectric layer 70 will range from greater than 0.5 micrometers ($\mu m$) up to about 2 $\mu m$, but typically will be about 1 $\mu m$ in thickness, i.e., the same thickness as first dielectric layer 10.

Regardless of what dielectric material is used in the deposition of third dielectric layer 70 over second dielectric layer 20, it is preferred that third dielectric layer 70 be applied as a low step coverage nonconformal coating over second dielectric layer 20 and the previously formed via(s), such as via 18/28. This type of dielectric layer is preferred so that the previously formed via does not completely fill with dielectric material while depositing third dielectric layer 70. In other words, what is desired here is a deposition method of forming third dielectric layer 70 which does a poor job of filling the newly formed via(s) such as via 18/28. Thus, the use of the term or expression herein "low step coverage, nonconformal coating" will be intended to mean a coating or formation of third dielectric layer 70 which either does not fill or at least only partially fills via 18/28.

Since the formation of low step coverage and nonconformal coatings have been the bane of those skilled in the art attempting to fill high aspect ratio trenches without forming voids, it is assumed that those skilled in the art will know all too well how to form such a low step coverage nonconformal layer of dielectric material which does not fill, or at least only partially fills via 18/28. However, one example of such a low step coverage nonconformal deposition procedure is a plasma enhanced CVD $SiO_2$ deposition carried out at a temperature of about 350° C. and a pressure of from about 1–100 Torr at a high deposition rate of about 3,000 Å to 5,000 Å per minute, using silane ($SiH_4$) as the source of silicon.

Figure 13:
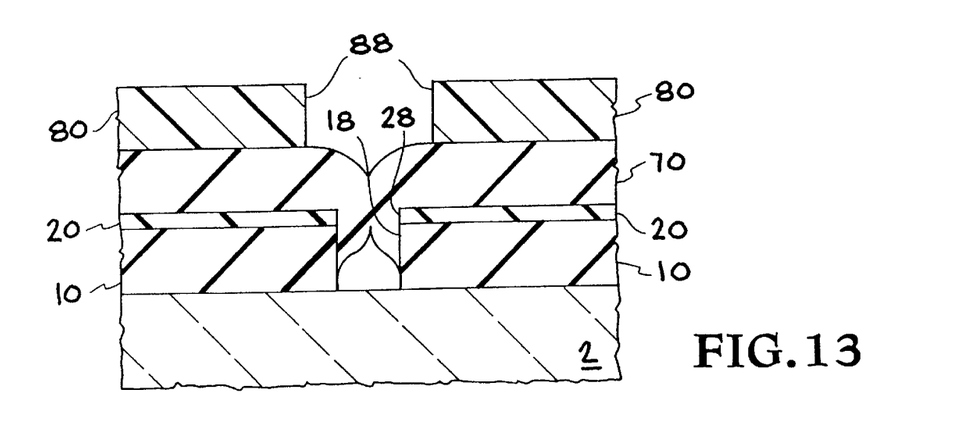
FIG. 13 is a fragmentary vertical cross-sectional view of the structure of FIG. 12 after formation of a second mask over the third dielectric layer.

After formation of low step coverage nonconformal third dielectric layer 70 over second dielectric layer 20 and the newly formed via(s), a second mask 80 is applied over third dielectric layer 70, as shown in FIG. 13. Second mask 80, which may also comprise a photoresist mask, is formed with one or more mask openings 88 therein conforming to the pattern of one or more trenches to be etched in and through third dielectric layer 70.

After formation of second mask 80, the exposed portions of third dielectric layer 70 are etched through down to second dielectric layer 20, which acts as an etch stop. When third dielectric layer comprises preferred material silicon oxide ($SiO_2$), and second dielectric layer 20 preferably comprises silicon nitride, any silicon oxide etch selective to silicon nitride may be used such as, for example, the previously described $CF_4$, $C_4F_8$, and argon plasma etch system.

Figure 14:
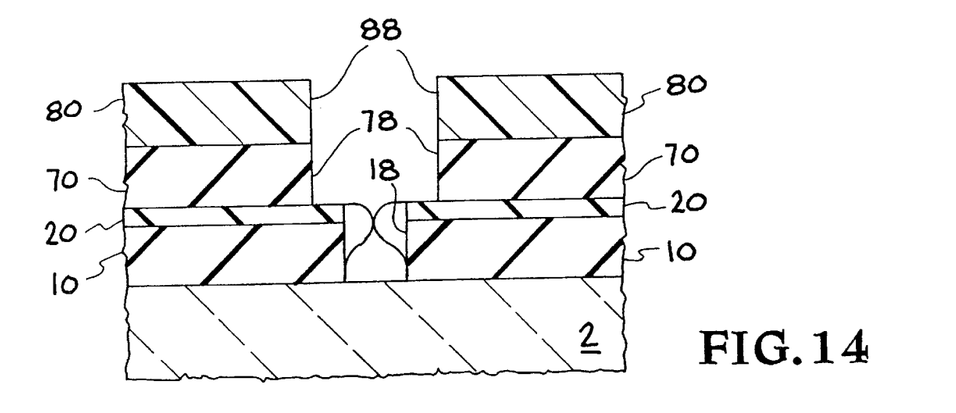
FIG. 14 is a fragmentary vertical cross-sectional view of the structure of FIG. 13 showing the etching of a trench opening in the third dielectric layer through an opening in the second mask.

When the etch reaches the second dielectric layer etch stop, the structure appears as illustrated in FIG. 14 with the exposed portions of third dielectric layer 70 completely etched away down to the level of second dielectric layer 20, but with further third dielectric layer material remaining in the via(s) 18/28 from the initial deposition. To remove this material, the etch is continued briefly for a period of time, e.g., for from about 10 seconds to about 40 seconds longer to clear the remaining portions of third dielectric material 70 from the via(s), with second dielectric layer then functioning briefly as an etch mask through which the third dielectric layer material remaining in vias(s) 18/28 is etched away.

Figure 15:
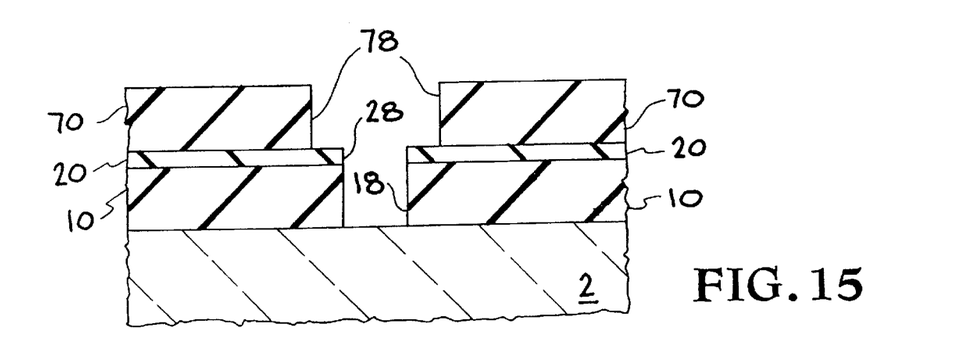
FIG. 15 is a fragmentary vertical cross-sectional view of the structure of FIG. 14 showing the further etching of the structure to remove any third dielectric layer material from the via previously formed in the first and second dielectric layers.

After the clearing or removal of the third dielectric material from via(s) 18/28, second mask 80 is removed resulting in the final structure shown in FIG. 15. This structure is then ready for conventional processing to recommence to provide trench and via liners where needed and appropriate, and metal filling of both the trenches and vias.

It should be noted that while the invention has been described in accordance with the preferred use of silicon oxide ($SiO_2$) for the first and third dielectric layers, with a thin dielectric layer of, for example, silicon nitride located therebetween which functions as an etch stop and, in part, as an etch mask, it should be noted that by the right choice of dielectric materials, it would be possible to construct the illustrated structure in accordance with the invention using only two layers. That is, first and second dielectric layers 10 and 20 could be consolidated into a single dielectric layer having different etch characteristics than uppermost (third) dielectric layer 70, provided that such a consolidated dielectric layer was compatible with underlying materials as well as with the material comprising the upper dielectric layer in which the trench is formed.

Thus, the invention provides an improved process for forming vias in one dielectric layer of a multiple dielectric layer structure with trenches formed in another dielectric layer, and with preferably another layer of dielectric material (having different etch characteristics than the other dielectric layers) provided between the other dielectric layers, to function as an etch stop and etch mask during construction of the other dielectric layers and the vias and trenches formed therein. The process of the invention forms vias and trenches in multiple dielectric layers while avoiding the problems of etch mask stress on the thin dielectric layer, or use of a complicated second mask, or the formation of high aspect ratio openings which characterize the prior art processes for forming such structures.

Having thus described the invention what is claimed is:
1. A process for respectively forming vias and trenches in two separate dielectric layers consisting of:
   a) forming a first dielectric layer over an integrated circuit structure on a semiconductor substrate;

b) forming over said first dielectric layer a first mask, said first mask having one or more openings therein corresponding to one or more vias to be formed in said first dielectric layer;

c) etching said first dielectric layer through said first mask to form one or more vias extending through said first dielectric layer;

d) removing said first mask;

e) forming a second dielectric layer over said first dielectric layer, said second dielectric layer having different etch characteristics than said first dielectric layer;

f) forming over said second dielectric layer a second mask, said second mask having one or more mask openings therein for forming one or more trenches in said second dielectric layer in registry with said one or more vias;

g) etching said second dielectric layer through said openings in said second mask down to said first dielectric layer to form one or more trenches in said second dielectric layer, while also removing any material from said second dielectric layer deposited in said previously formed one or more vias in said first dielectric layers, said first dielectric layer providing an etch stop for said etching of said second dielectric layer to form said one or more trenches.

2. The process of claim 1 wherein one of said first and second dielectric layers comprises silicon oxide ($SiO_2$).

3. The process of claim 1 wherein one of said first and second dielectric layers comprises silicon nitride.

4. The process of claim 1 wherein said first and second dielectric layers each ranges in thickness from greater than 0.5 micrometers $\mu$m up to about 2 $\mu$m.

5. A process for respectively forming vias and trenches in two separate dielectric layers comprises:

a) forming a first dielectric layer over an integrated circuit structure on a semiconductor substrate;

b) forming a thin second dielectric layer over said first dielectric layer;

c) forming over said second dielectric layer a first mask, said first mask having one or more openings therein corresponding to one or more vias to be formed in said first and second dielectric layers;

d) etching said first and second dielectric layers through said first mask to form one or more vias extending completely through both said first and second dielectric layers;

e) removing said first mask;

f) forming a third dielectric layer over said thin second dielectric layer, said third dielectric layer having different etch characteristics than said second dielectric layer;

g) forming over said third dielectric layer a second mask, said second mask having one or more mask openings for forming one or more trenches in said third dielectric layer in registry with said one or more vias;

h) etching said third dielectric layer through said openings in said second mask to form one or more trenches in said third dielectric layer, while also removing any material from said third dielectric layer deposited in said previously formed one or more vias in said first and second dielectric layers.

6. The process of claim 5 wherein said third dielectric layer comprises the same dielectric material as said first dielectric layer.

7. The process of claim 5 wherein said second dielectric layer acts as an etch stop during said step of etching said third dielectric layer through said openings in said second mask to form said one or more trenches in said third dielectric layer.

8. The process of claim 7 wherein said second dielectric material acts as an etch mask during said removal of any material from said third dielectric layer which has deposited in said one or more vias previously formed in said first and second dielectric layers.

9. The process of claim 5 wherein said third dielectric layer is formed over said thin second dielectric layer as a low step coverage, nonconformal coating layer to inhibit filling said one or more vias in said first and second dielectric layers with material from said third dielectric layer.

10. The process of claim 5 wherein said first dielectric layer comprises silicon oxide ($SiO_2$).

11. The process of claim 5 wherein said first dielectric layer of silicon oxide ranges in thickness from greater than 0.5 micrometers $\mu$m up to about 2 $\mu$m.

12. The process of claim 5 wherein said thin second dielectric layer comprises silicon nitride.

13. The process of claim 12 wherein said second dielectric layer of silicon nitride ranges in thickness from about 500 Å up to about 1000 Å.

14. The process of claim 5 wherein said third dielectric layer comprises silicon oxide ($SiO_2$).

15. The process of claim 14 wherein said third dielectric layer of silicon oxide ranges in thickness from greater than 0.5 micrometers $\mu$m up to about 2 $\mu$m.

16. The process of claim 5 wherein said first and third dielectric layers comprise silicon oxide ($SiO_2$), and said thin second dielectric layer comprises silicon nitride.

17. The process of claim 5 including the further step of removing said second mask after said step of forming said one or more trenches in said third dielectric layer.

18. The process of claim 5 wherein said first and second mask comprise photoresist masks.

19. A process for respectively forming vias and trenches in two separate dielectric layers comprises:

a) forming a first dielectric layer of silicon oxide ($SiO_2$) over an integrated circuit structure on a semiconductor substrate;

b) forming a thin second dielectric layer of silicon nitride over said first dielectric layer, said second dielectric layer of silicon nitride having different etch characteristics than said first dielectric layer of silicon oxide;

c) forming over said second dielectric layer a first photoresist mask, said first photoresist mask having one or more openings therein corresponding to one or more vias to be formed in said first and second dielectric layers;

d) etching said first and second dielectric layers through said first photoresist mask to form one or more vias extending through both said first and second dielectric layers;

e) removing said first photoresist mask;

f) forming a third dielectric layer of silicon oxide ($SiO_2$) over said thin second dielectric layer, said third dielectric layer of silicon oxide having different etch characteristics than said second dielectric layer of silicon nitride;

g) forming over said third dielectric layer a second photoresist mask, said second photoresist mask having one or more mask openings for forming one or more trenches in said third dielectric layer in registry with said one or more vias;

h) etching said third dielectric layer through said openings in said second photoresist mask down to said second dielectric layer to form one or more trenches in said third dielectric layer, while also removing any material from said third dielectric layer deposited in said previously formed one or more vias in said first and second dielectric layers, said second dielectric layer of silicon nitride providing an etch stop for said etching of said third dielectric layer to form said one or more trenches; and i) removing said second photoresist mask.

20. The process of claim 19 wherein said first dielectric layer of silicon oxide ranges in thickness from greater than 0.5 micrometers μm up to about 2 μm.

21. The process of claim 19 wherein said second dielectric layer of silicon nitride ranges in thickness from about 500 Å up to about 1000 Å.

22. The process of claim 19 wherein said third dielectric layer of silicon oxide ranges in thickness from greater than 0.5 micrometers μm up to about 2 μm.

23. A process for respectively forming vias and trenches in two separate dielectric layers consisting of:

a) forming a first dielectric layer over an integrated circuit structure on a semiconductor substrate, said first dielectric layer comprising a dielectric material selected from the group consisting of silicon oxide and silicon nitride;

b) forming over said first dielectric layer a first resist mask, said first resist mask having one or more openings therein corresponding to one or more vias to be formed in said first dielectric layer;

c) etching said first dielectric layer through said first resist mask to form one or more vias extending through said first dielectric layer;

d) removing said first resist mask;

e) forming a second dielectric layer over said first dielectric layer, said second dielectric layer having different etch characteristics than said first dielectric layer, said second dielectric material selected from the group consisting of silicon oxide and silicon nitride, but comprising a different dielectric material than said first dielectric layer;

f) forming over said second dielectric layer a second resist mask, said second resist mask having one or more mask openings therein for forming one or more trenches in said second dielectric layer in registry with said one or more vias;

g) etching said second dielectric layer through said openings in said second resist mask down to said first dielectric layer to form one or more trenches in said second dielectric layer, while also removing any material from said second dielectric layer deposited in said previously formed one or more vias in said first dielectric layer, said first dielectric layer providing an etch stop for said etching of said second dielectric layer to form said one or more trenches.

* * * * *